United States Patent
Vinciguerra et al.

(10) Patent No.: US 8,470,283 B2
(45) Date of Patent: Jun. 25, 2013

(54) METHOD FOR GROWING CARBON NANOTUBES HAVING A PREDETERMINED CHIRALITY

(75) Inventors: Vincenzo Vinciguerra, Biancavilla (IT); Maria Fortuna Bevilacqua, Gragnano (IT); Francesco Buonocore, Angri (IT); Salvatore Coffa, Tremestieri Etneo (IT)

(73) Assignee: STMicroelectronics S.R.L., Agrate Brianza (MB) (IT)

( * ) Notice: Subject to any disclaimer, the term of this patent is extended or adjusted under 35 U.S.C. 154(b) by 963 days.

(21) Appl. No.: 11/913,476

(22) PCT Filed: May 3, 2006

(86) PCT No.: PCT/EP2006/004109
§ 371 (c)(1),
(2), (4) Date: Aug. 27, 2008

(87) PCT Pub. No.: WO2006/117196
PCT Pub. Date: Nov. 9, 2006

(65) Prior Publication Data
US 2009/0060827 A1    Mar. 5, 2009

(30) Foreign Application Priority Data
May 3, 2005   (IT) ............................... MI2005A0797

(51) Int. Cl.
*D01F 9/12* (2006.01)
(52) U.S. Cl.
USPC ...................................................... 423/447.1
(58) Field of Classification Search
USPC ........................................ 977/848; 423/447.3
See application file for complete search history.

(56) References Cited

U.S. PATENT DOCUMENTS

| 5,126,574 | A | * | 6/1992 | Gallagher | 250/492.2 |
| 5,591,312 | A | * | 1/1997 | Smalley | 204/157.41 |
| 6,325,909 | B1 | * | 12/2001 | Li et al. | 205/106 |
| 6,841,139 | B2 | * | 1/2005 | Margrave et al. | 423/447.1 |
| 7,258,590 | B2 | * | 8/2007 | Oyama et al. | 445/50 |
| 7,347,981 | B2 | * | 3/2008 | Crespi et al. | 423/447.1 |
| 7,413,723 | B2 | * | 8/2008 | Niu et al. | 423/447.3 |
| 7,504,570 | B2 | * | 3/2009 | Kawabata | 423/445 B |
| 2002/0004028 | A1 | | 1/2002 | Margrave et al. | |
| 2008/0213162 | A1 | * | 9/2008 | Smalley et al. | 423/447.7 |

FOREIGN PATENT DOCUMENTS

WO    WO 03/086969    4/2003

OTHER PUBLICATIONS

Zhu et al (Self-Catalytic Behavior of Carbon Nanotubes, J Am Chem Soc., 2005, 127, 15698-15699).*
Setlur et al (A Promising Pathway to Make Multiwalled carbon nanotubes, Applied Phys Lett, 2000, vol. 76, No. 21, pp. 3008-3010).*

(Continued)

*Primary Examiner* — Emily Le
*Assistant Examiner* — Michael Forrest
(74) *Attorney, Agent, or Firm* — Allen, Dyer, Doppelt, Milbrath & Gilchrist, P.A.

(57) ABSTRACT

A method for growing carbon nanotubes having a determined chirality includes fragmenting at least one initial carbon nanotube having a determined chirality to obtain at least two portions of carbon nanotube. Each portion has a free growth end. Atoms of carbon are supplied with an autocatalyst addition of the atoms of carbon at the free growth end of each portion of nanotube to determine an elongation or growth of the nanotube.

25 Claims, 3 Drawing Sheets

OTHER PUBLICATIONS

Charlier J-C, et al.: Microscopic growth mechanisms for carbon nanotubes: *Science American Assoc. Adv. Sci. USA,* vol. 275, No. 5300, pp. 646-649 (Jan. 31, 1997).

Setlur A. A., et al.: "A promising pathway to make multiwalled carbon nanotubes" *Applied Physics Letters, AIP, American Institute of Physics,* vol. 76, No. 21, pp. 3008-3010 (May 22, 2000).

* cited by examiner

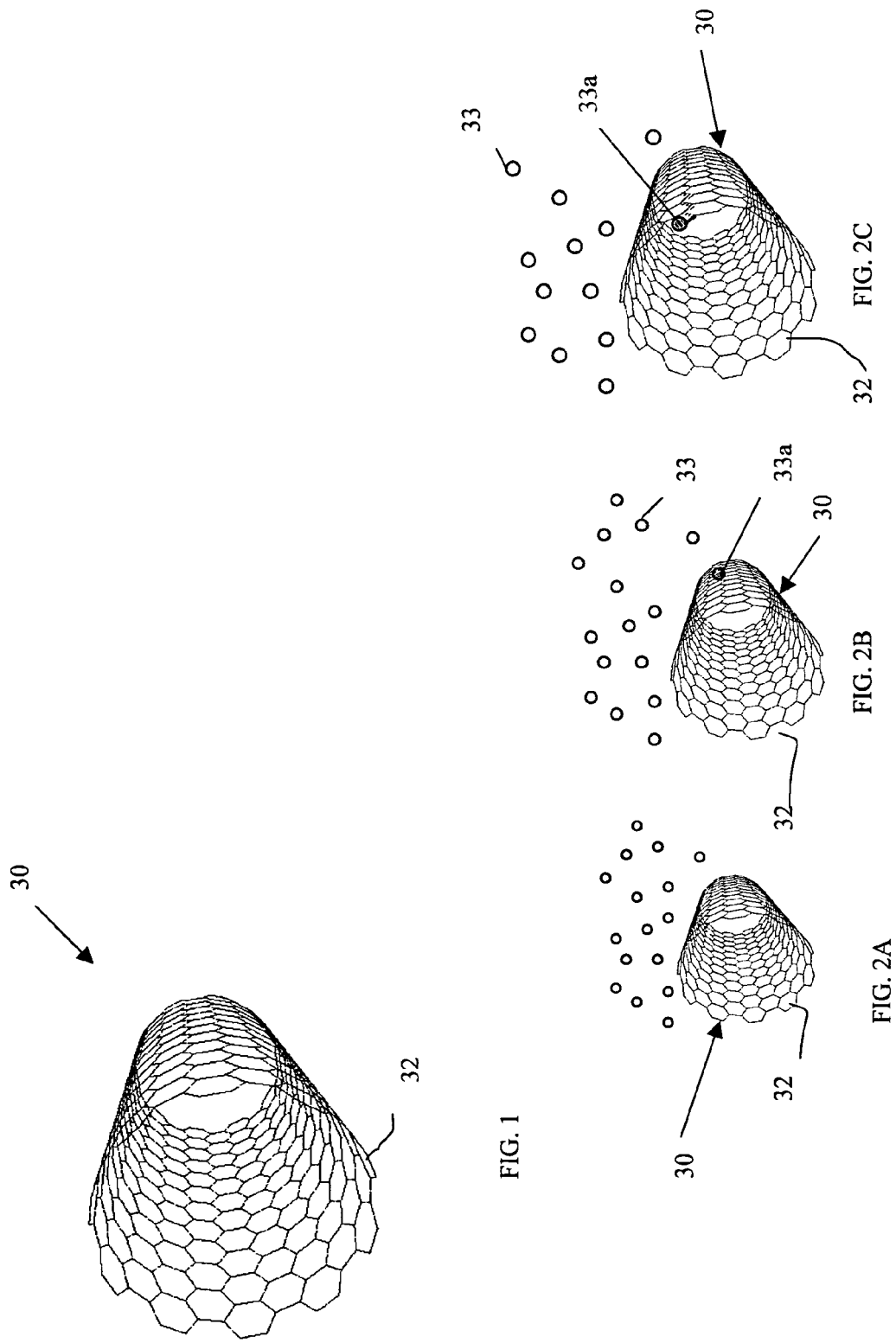

METHOD FOR GROWING CARBON NANOTUBES HAVING A PREDETERMINED CHIRALITY

FIELD OF THE INVENTION

The present invention generally relates to the field of carbon nanotubes, and in particular, to a method for growing carbon nanotubes having a predetermined chirality. The method according to the present invention can be used for making electronic circuits formed by carbon nanotubes.

BACKGROUND OF THE INVENTION

There is an increasing interest in the use of carbon nanotubes in the electronic field, and in general, in information technologies. This interest is particularly due to the electrical properties of carbon nanotubes, which substantially depend on their structure and geometry.

Carbon nanotubes substantially include cylindrical structures of atoms of carbon arranged in an hexagonal configuration, and having a high length-diameter ratio (diameters on the order of several atoms and lengths up to several microns). In particular, nanotubes can be imagined as being substantially formed by a graphite sheet (graphene) rolled up and ending with a half-ball, or crown, of fullerene. Nanotubes can be both single-wall (SWNT, Single-Wall carbon Nano Tube), and multi-wall (MWNT, Multi-Wall carbon Nano Tube) formed by two or more coaxial structures of SWNT. Carbon nanotubes are formed through Chemical Vapor Deposition (CVD), laser ablation, or arc discharge.

On the basis of the diameter and the chirality, i.e., the value of the angle the hexagonal structure of the single graphite sheet is rolled up with, which composes them, carbon nanotubes formed by the graphite sheet with the above techniques can show a metallic or semi-conductive behaviour.

In particular, the natural use of metallic nanotubes is the fabrication of nanowires, which essentially conducts current on a surface and provide small, low resistivity interconnections that conduct high density current. As semiconductors, they can instead be integrating part of a transistor.

To selectively exploit the electrical properties of the typology of carbon nanotubes, several technologies have been devised which enable separation of the semiconductor nanotubes from the metallic ones after they have been developed. The separation of the nanotubes having different chirality, and thus different electrical properties, has been considered up to now as the "holy grail" of the nanotubes field.

In particular, the possibility of controlling the chirality stands for the possibility of making a real new generation of electronic devices comprising circuits only formed by SWNTs, or alternatively by MWNTS, wherein semiconductor nanotubes play the role of active elements (transistors with FETs field effect, logic elements), while metallic nanotubes play the role of connectors.

Some separation technologies are known from the following publications: Separation of Metallic from Semiconducting Single-Walled Carbon Nanotubes, Krupke et al., Science 301, 344-347 (2003), A Route for Bulk Separation of Semiconducting from Metallic Single-Wall Carbon Nanotubes, Chattophadhyay et al., Am. Chem. Soc. 125, 3370-3375 (2003); DNA-Assisted Dispersion and Separation of Carbon Nanotubes, Zheng et al., Nature Mater. 2, 338-342 (2003); Chen et al., A.G. Abstract B26.013, March 2003 Meeting of the American Physical Society; http://www.aps.org/meet/MAR03/baps/abs/S660.html; Structure-Assigned Optical Spectra of Single-Walled Carbon Nanotubes, Bachilo et al., Science 298, 2361-2366 (2002).

Among the above-proposed techniques, the dielectrophoresis seems to be, at the moment, the most promising. In accordance with this technique, a mixture of metallic and semi-conductive carbon nanotubes, just manufactured, can be separated in a solution of micelles of carbon nanotubes in SDS (sodium dodecyl sulfate) using an alternated electrical field at a high frequency ($v>1$ MHz).

After the separation of the nanotubes, the real electronic circuits are obtained by a selective assembly of the nanotubes. To achieve this purpose, among the known solutions, the use of an assembly method exploiting the electrical field has been suggested, for example, by contacting single bundles of carbon nanotubes with alternating electrical fields, Krupke et al., Appl. Phys., A 76 397-400 (2003); Self-Assembled, Deterministic Carbon Nanotube Wiring Networks, Diehl et al., Angewandte Chemie International, Edition 41, 353-356 (2002).

This method, although being relatively efficient, is still particularly disadvantageous from an economic point of view. To overcome this drawback, the use of the ULSI technique has been proposed, i.e., a relatively economic process which enables grouping of more than a million electronic components on a single chip.

However, to exploit the advantages of a ULSI process (ultra large scale integration), it is necessary to devise a technique for growing nanotubes which can be integrated directly in a ULSI process. This is done to obtain, directly when forming the nanotubes, several selected circuits at a relatively reduced cost.

In this respect, the above CVD process (chemical vapor deposition) has been indicated, among the several known techniques for developing SWNT or MWNT nanotubes, as the most suitable to be used in a ULSI process (see Growth Mechanisms in Chemical Vapor Deposited Carbon Nanotubes, Vinciguerra et al., Nanotechnology 14(6): 655-660 (2003) and the relative reference therein.

The CVD process also has the advantage of enabling, during the growth, a good control on the position of the carbon nanotubes. However, the CVD process, although being suitable for being integrated in a ULSI process, still has an unsolved drawback.

The drawback stays in that a CVD process does not enable a controlled chirality growth of the carbon nanotubes to be obtained. In particular, a CVD process, which substantially provides the formation of the nanotubes by way of a decomposition of an organo-metal in the gaseous phase with a metallic catalyst present, enables one to obtain nanotubes having a wide distribution of the diameters and of chirality or elicity. This prevents control of the chirality, and thus of the electronic properties of the nanotubes obtained.

As a consequence, in the absence of a control on the chirality of the nanotubes, it is not possible to integrate the growth of the nanotubes in a process directly aimed at the fabrication of electronic circuits.

A method for the formation of nanotubes with controlled chirality is known, for example, from U.S. Pat. No. 6,645,455. The method provides the preparation of carbon nanotubes derived with nucleophilic substituents, as fluorides, which facilitate the solvation and the recovery of the single carbon nanotubes from a solution. This enables the properties of the carbon nanotubes to be controlled. The carbon fluoro-nanotubes obtained are selected on the basis of the desired chirality, and they are bound with precursors of metallic catalysts able to release suitable amounts of reaction catalyst. Once bound to these precursors, the carbon fluoro-nanotubes are used as growth nuclei for obtaining fibers of nanotubes having predetermined chirality.

The known method, although enabling to control the chirality, requires several working steps. There is also a disadvantage of requiring the use of large amounts of compounds, such as the nucleophilic reactants, and the precursors of the metallic catalysts.

SUMMARY OF THE INVENTION

In view of the foregoing background, an object of the present invention is to provide a method for the formation of carbon nanotubes which, although enabling to control the chirality of the nanotubes exactly during their growing step, requires a reduced number of process steps as well as a reduced number of reactants.

This and other objects, features and advantages in accordance with the present invention are provided by using a nanotube having a predetermined chirality as a potential growth nucleus that is able to attract atoms of carbon coming from the degradation of the reactive species in the gaseous phase so as to enable the elongation of the nanotube itself with a substantially autocatalytic process, without the use of metallic catalysts.

A method for the formation of nanotubes comprises the steps of fragmentation of at least one initial carbon nanotube having a determined chirality with obtainment of at least two portions, or seeds of carbon nanotubes, each of them showing a free growth end. Atoms of carbon may be supplied on the nanotube portions. The method may further comprise an autocatalyst addition, or autocatalyst binding, of the atoms of carbon at the free end of each portion of nanotubes to determine the nanotube elongation.

According to a further characteristic of the method, there may be a growth of macroscopic amounts of nanotubes on a substrate. Moreover, the nanotubes may be subjected to a suitable electrical field to obtain a desired circuit having a predetermined arrangement of the metallic, and respectively, semiconductor components on the substrate. On the macroscopic amount of nanotubes, a difference of potential may be applied to determine a predetermined orientation of the nanotubes.

BRIEF DESCRIPTION OF THE DRAWINGS

Further characteristics and the advantages of the method according to the invention will be apparent from the following description of an embodiment thereof given by way of indicative and non-limiting examples with reference to the annexed drawings.

FIG. 1 is a schematic view of a carbon nanotube according to the invention.

FIGS. 2A-2C are schematic views of three carbon nanotubes during an autocatalyst growing process of the nanotube according to the invention.

DETAILED DESCRIPTION OF THE PREFERRED EMBODIMENTS

Figure 3:
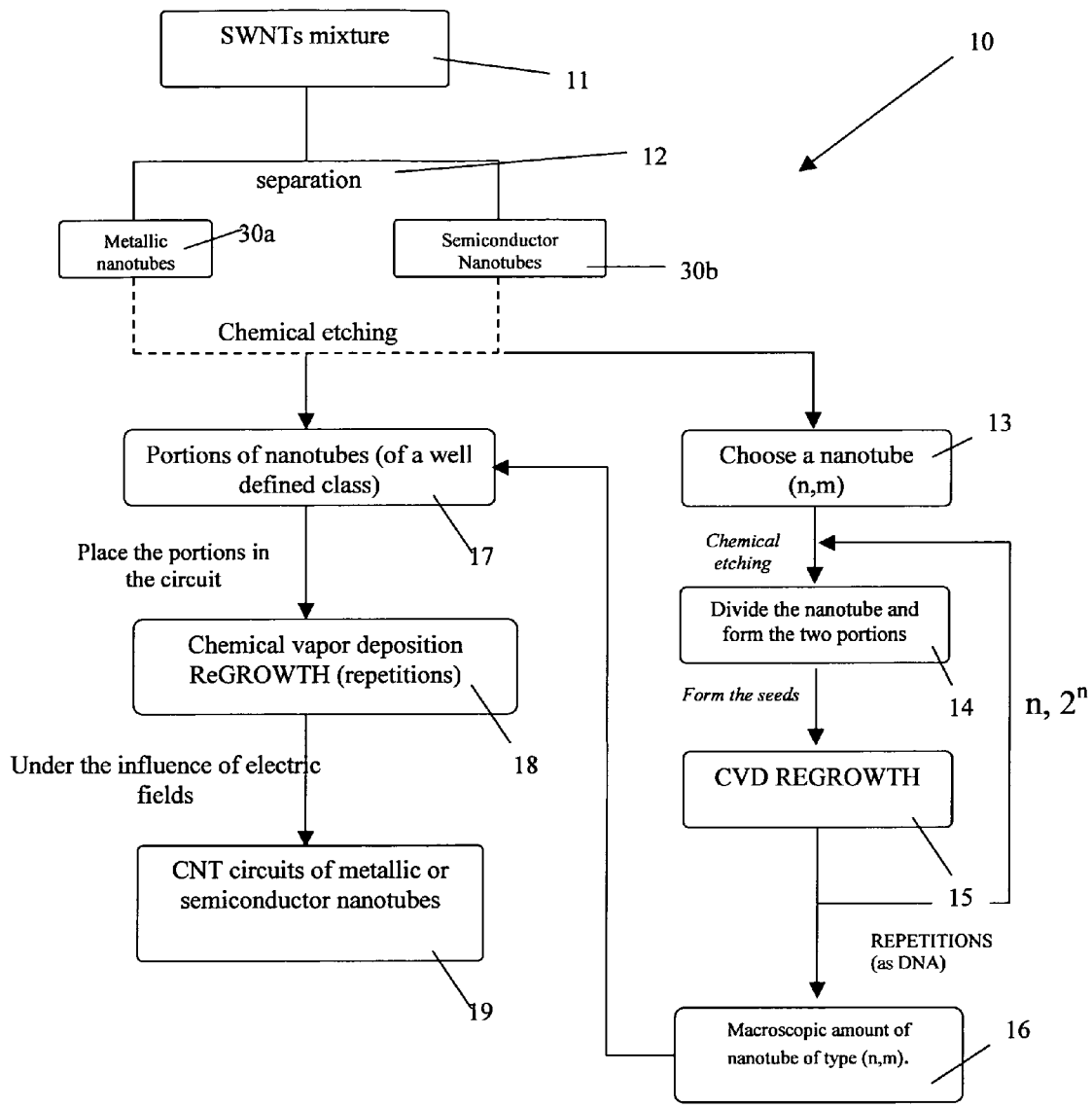
FIG. 3 shows a block diagram of the method according to the invention.

With reference to the annexed figures, reference number 10 generally indicates a method for the growth of carbon nanotubes 30 having controlled chirality. The method 10 comprises a preparatory step 11 during which initial carbon nanotubes are made without control of the chirality. In particular, a mixture of starting or initial nanotubes, both metallic 30a and semi-conductive 30b, or semiconductors, is obtained.

To make the initial nanotubes 30, any known technology may be used, such as arc discharge, laser ablation or chemical vapor deposition. For example, the nanotubes have been grown in methane flow on a substrate maintained at 900° C. under a pressure of 750 torrs in which SWNTs nanotubes have been obtained.

In terms of a catalyst, an iron catalyst has been used, which has been deposited in the form of nanoparticles from a nanomolar dispersion of ferric salts in isopropyl alcohol. Subsequently, the mixture of starting nanotubes 30 is subjected to a separation process 12 by which the metallic 30a and semiconductive nanotubes 30b are separated so as to obtain nanotubes having different chirality.

In terms of a separation technique, any technology can be used among the above-mentioned ones, and preferably the above dielectrophoresis. For example, in case the dielectrophoresis technique is used, a few micro-liters of a suspension of nanotubes in SDS (sodium dodecyl sulfate) are deposited between the electrodes of an interdigitalized system of microelectrodes. Between the two electrodes a voltage of a few volts at a frequency of 1.5 MHz is applied. After a few seconds the drop is dried and the sample is observed.

Due to the dielectric force the metallic nanotubes 30a adhere to the electrodes, while the semiconductor nanotubes 30b are aligned in parallel to the force lines of the electrical field without shifting from the center of the sample.

As a result of the different positions in the suspension of metallic 30a and semiconductor nanotubes 30b, a simple separation of the same is possible. According to a currently known nomenclature, on the basis of their structure, the carbon nanotubes are identified with a code (n, m) composed of two integer numbers. These numbers indicate how to cut a graphite sheet so as to make a cylindrical tube. When the two numbers n, m are identical the nanotubes 30 have metallic properties.

The above separation thus enables a selection 13 of nanotubes 30 having a predetermined chirality, also indicated with the code (n, m). Subsequently, after the separation, a nanotube 30 having a defined chirality (n, m) is subjected to a fragmentation step 14 wherein the nanotube 30 is fragmented into at least two portions, or seeds, each of them having an open free end 32 for the growth.

For each starting nanotube 30 at least two nanotubes with reduced length are thus obtained. The nanotubes 30 are fragmented by any technology, such as fragmentation by oxidizing chemical agents etching, or by microwaves or ultrasounds.

Preferably, the fragmentation of the nanotubes 30 occurs through oxidation. The fragmentation technique through oxidation exploits the presence of faults on the wall of the nanotubes 30, which serve as starting points of the fragmentation. The process is carried out under the following operating conditions.

Initially, a suspension of the nanotubes is formed, for example, above the semiconductors 10b. The suspension is separated according to the above-described methods in a 3:1 mixture of sulphuric acid (98%)/nitric acid (65%), and is subjected to sonication at 45 kHz, 55° C. for 30 minutes.

The suspension is filtered and treated for about half an hour in a 4:1 mixture of sulphuric acid (98%)/oxygenated water (30%) so as to remove the carbonaceous particles. Finally, the fragments obtained are separated from the suspension through filtering.

Preferably, for each single fragmentation two portions of carbon nanotubes 30 are obtained. Subsequently, the portions of nanotubes 30 thus obtained are arranged on an inert substrate to enable a successive growing step 15.

To carry out the deposition on the substrate, the fragmented portions of nanotubes 30 are previously suspended by a surfactant, such as SDS, for example. SDS. From the solution thus obtained the deposition follows on a wide substrate portion, for example, 0.5 mm$^2$. A few suspension drops of the SDS containing the portions of nanotubes 30 are deposited on a substrate such as silicon oxide or silicon, for example.

After a few minutes the sample is rinsed with deionized water to remove the exceeding part of the suspension. The wait time before rinsing the sample is not limited. In fact, according to the wait time, a high amount of portions of nanotubes is deposited on the substrate with a relative density.

The nanotubes may be deposited so as to be located at a mutual distance of about 0.5-1 μm. In a successive step 15 atoms of carbon 33 (FIG. 2A) are supplied on each portion of nanotube 30. The supply of nanotubes of carbon 33 occurs through chemical vapor deposition.

The supply of atoms of carbon 33 is carried out so as to obtain an autocatalyst addition, or autocatalyst bonding reaction, of the atoms of carbon 33 at the free ends 32 of the nanotubes 30. The atoms of carbon 33, once added, are made to diffuse along the surface of the portions of nanotube 30 until they are bound to the atoms of carbon having free binding sites on the edge of the free end 32 of the nanotubes 30 (FIGS. 2A-2C). FIGS. 2B and 2C indicate, with reference number 33a, the atom of carbon which diffuses on the surface of the nanotube 30.

The principle of the method is in using the portions of nanotube 30, obtained through fragmentation, as a base nuclei or core to promote the growth of longer nanotubes without the use of catalysts outside the nanotube itself. A growth of the nanotubes is thus obtained, which is catalysed by the same nuclei or seeds, whereon the growth itself occurs. Such a process is substantially like an epitaxial process.

To carry out the autocatalysed addition, the fragments of nanotube 30 undergo determined operative conditions. In a preferred embodiment, the nanotubes 30 are subjected to the same growth conditions as previously listed to make the starting or initial nanotubes, i.e., in methane atmosphere at 900° C. and at the pressure of 750 torrs. Moreover, the substrate whereon the fragments of nanotubes 30 are deposited is electrically biased.

The electric field is applied between the substrate and another electrode placed near the substrate itself. According to a further embodiment, in a similar way with respect to what has been previously described, the electrical field is applied between patterned electrodes arranged on the surface of the substrate whereon the nanotubes are deposited.

A difference of potential of a few volts, for example, 2-3 volts is applied. A difference of potential of even a few volts is able to generate the nanometric dimensions of the diameters of the nanotubes 30 being considered, with electrical fields higher than 10$^9$ V/m conditioning the growing process.

In fact, in the absence of the catalyst and in the presence of these high electrical fields, in a CVD chamber with methane atmosphere, it is possible to carry out the growth of graphene sheets, i.e., of structures organized according to the honeycomb molecular structure of the graphite.

As above anticipated, under these conditions the presence of the portions of nanotubes 30 already formed serves as a mold to orient the growth, i.e., the elongation, of the nanotubes.

In a preferred solution, the up to now described steps of fragmentation 12, arrangement or location on the substrate 14, and autocatalyst growth 15 of each nanotube 30 of determined chirality (n, m), are cyclically repeated for n times, so as to obtain in a final step 16, a macroscopic amount of $2^n$ nanotubes 30 having a predetermined chirality (n, m).

In a preferred solution, the method for developing the nanotubes 30 described up to now is integrated in a process for the fabrication of electronic circuits. In particular, in an initial step 17, the obtained macroscopic amount of $2^n$ nanotubes 30 that belong to a determined class of chirality (n, m) are arranged on a substrate 34 (FIG. 4) for the fabrication of the circuit. In this case, the nanotubes serve as the nuclei for the growth and the successive elongation.

The deposition of the plurality of $2^n$ nanotubes 30 preferably occurs by a suspension. The suspension used is substantially similar to the one described above. That is, the macroscopic amount of $2^n$ nanotubes is suspended in a surfactant such as SDS, for example. With the suspension thus obtained, the deposition follows on the portion of substrate 34. The deposition may be carried out so that the nanotubes 30 are arranged at a mutual distance of 1 μm.

Metallic nanotubes 30a and semiconductor nanotubes 30b may be simultaneously arranged on the substrate 34. According to a further embodiment, the metallic nanotubes 30a and the semiconductor nanotubes 30b are arranged on the substrate 34 in two different steps.

In a successive step 18, the macroscopic amount of nanotubes 30 is subjected to chemical vapour deposition to enable a further autocatalyst growth thereof. The further autocatalyst growth is carried out according to the same modes as described above.

Figure 4:
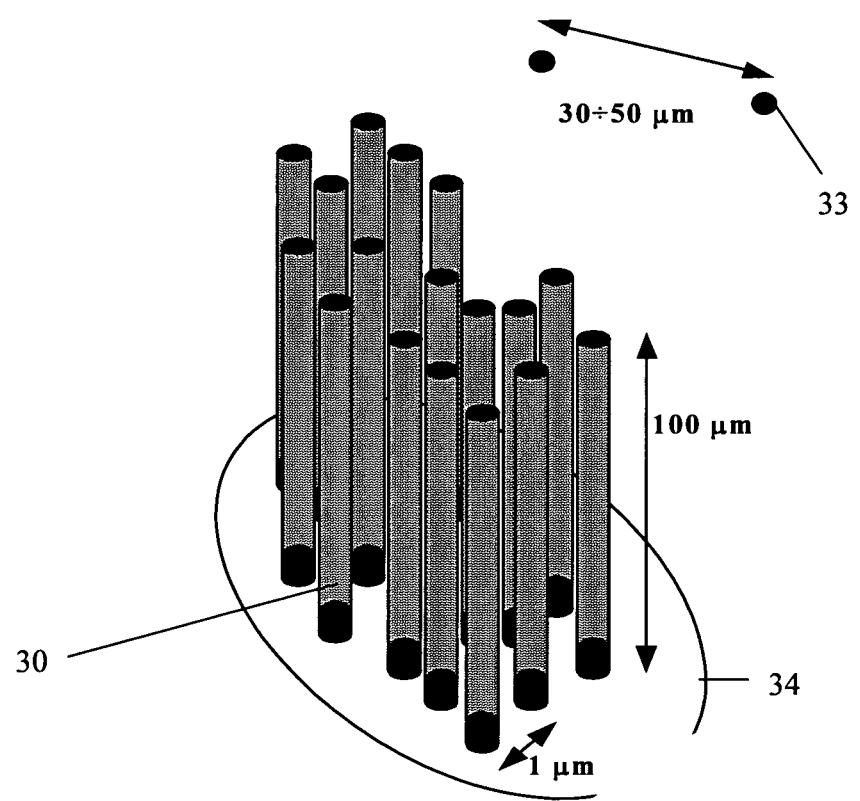
FIG. 4 shows a bundle of nanotubes arranged on a substrate obtained by the method according to the invention.

The autocatalyst growth follows until nanotubes having a length of at least 100 μm are obtained. In this way, a bundle of nanotubes 30 elongated on the substrate 34 and having controlled chirality is obtained (FIG. 4).

The deposition is assisted by alternated electrical fields which can serve to orient the nanotubes themselves with respect to the substrate 34. In other words, the nanotubes 30 are subjected to a suitable electrical field, to obtain a desired circuit having a predetermined arrangement of the metallic, and respectively, semiconductor components.

To do this, the substrate 34 whereon the nanotubes 30 are deposited comprises a patterned system of electrodes provided with pads. The pads are supplied, according to the configuration which is to be created, by an alternated voltage of 5-10 V and at a frequency of 30 kHz.

It is to be noted that, in case the distance between the electrodes is on the order of tens of microns, the mean electrical field applied is on the order of 10$^6$ V/m. Such an electrical field mainly has a an orienting effect on the nanotubes.

The method as described above can be carried out by an ULSI integration process (ultra large scale integration). That is, the known process in use for the construction of the current microelectronic circuits which serves to constitute the circuitry and the accessory devices.

The main advantage of the method is that of obtaining a growth of the nanotubes with controlled chirality during their development without requiring the use of catalysts or other external agents. In particular, it is possible to grow a carbon nanotube on a nanotube nucleus. This enables a nucleation step of the nanotubes by way of metallic catalysis to be avoided.

A further advantage of the illustrated method is in making the controlled chirality growth using techniques of growth of nanotubes that are simple to be actuated, such as the chemical vapor deposition. Yet a further advantage is the possibility of cyclically repeating the growing method to produce macroscopic amounts of nanotubes. The possibility follows an easy automation of the growing process of the nanotubes.

A further advantage is the possibility of integrating the growing method in a process for the fabrication of electronic circuits. To achieve this purpose, the method enables one to make macroscopic amounts of nanotubes with controlled chirality directly on a patterned system provided with pads, so as to obtain a predetermined arrangement of metallic nanotubes and of semiconductor nanotubes.

Obviously, one skilled in the art will be allowed to contribute several changes and versions to the above-described method, so as to meet contingent and specific needs. All of the above falls within the scope of protection as defined by the following claims.

That which is claimed:

1. A method for growing carbon nanotubes having a determined chirality, the method comprising:
   separating at least one initial carbon nanotube having the determined chirality into at least two portions, each portion having one free growth end; and
   supplying atoms of carbon with an autocatalyst to add atoms of carbon at the free growth end of each portion of the at least one initial carbon nanotube for growth thereof without the use of a metallic catalyst.

2. The method according to claim 1, wherein the supplying comprises diffusing the atoms of carbon along a surface of each portion of the at least one initial carbon nanotube until the atoms of carbon are bound to the atoms of carbon having free binding sites on an edge of the free end.

3. The method according to claim 1, wherein the autocatalyst addition of the atoms of carbon are supplied when the atoms of carbon are supplied, and with each portion of the at least one initial carbon nanotube being electrically biased.

4. The method according to claim 3, wherein each portion of the at least one initial carbon nanotube is arranged on a substrate; and further comprising applying a difference of potential between the substrate and an electrode placed near the substrate.

5. The method according to claim 3, wherein each portion of the at least one initial carbon nanotube is deposited on a substrate; and further comprising applying a difference of potential between electrodes arranged on a surface of the substrate.

6. The method according to claim 3, wherein the electrical bias is greater than $10^9$ V/m.

7. The method according to claim 1, further comprising mixing each portion of the at least one initial carbon nanotube with a surfactant to form a suspension before supplying the atoms of carbon.

8. The method according to claim 1, wherein the atoms of carbon are supplied through a chemical vapor deposition.

9. The method according to claim 8, wherein the atoms of carbon are supplied by maintaining each portion of the at least one initial carbon nanotube in a methane atmosphere.

10. The method according to claim 8, wherein each portion of the at least one initial carbon nanotube is maintained at a temperature of 900° C. and under a pressure of 750 torrs during the supplying of the atoms of carbon.

11. The method according to claim 1, wherein the at least one initial carbon nanotube is obtained by separating a mixture of nanotubes having a different chirality.

12. The method according to claim 1, wherein the steps of separating and supplying are repeated n times, with n being greater than 1, to obtain a macroscopic amount of $2^n$ metallic or semiconductor nanotubes.

13. The method according to claim 12, wherein the macroscopic amount of $2^n$ nanotubes is arranged on a substrate, and the atoms of carbon are supplied to determine a further autocatalyst addition so as to obtain a bundle of nanotubes grown on the substrate.

14. The method according to claim 13, further comprising electrically biasing the bundle of nanotubes to obtain a desired circuit with a predetermined arrangement of metallic and semiconductor nanotubes.

15. The method according to claim 14, wherein the bundle of nanotubes is arranged on a pattern of electrodes serving as substrate, and wherein the pattern of electrodes is electrically biased according to desired circuit to be obtained.

16. The method according to claim 15, wherein the pattern of electrodes is electrically biased at an electrical field of $10^6$ V/m to provide an orienting effect on the bundle of nanotubes.

17. The method according to claim 13, further comprising an ultra large scale integration (VLSI) step after the further autocatalyst addition to form accessory circuits.

18. A method for growing carbon nanotubes comprising:
   separating a mixture of nanotubes having a different chirality to obtain at least one initial carbon nanotube having a determined chirality;
   separating at least one initial carbon nanotube into at least two portions, each portion having one free growth end;
   electrically biasing each portion of the at least one initial carbon nanotube; and
   supplying atoms of carbon with an autocatalyst to add atoms of carbon at the free growth end of each portion of the at least one initial carbon nanotube for growth thereof without the use of a metallic catalyst during the electrical biasing.

19. The method according to claim 18, wherein the supplying comprises diffusing the atoms of carbon along a surface of each portion of the at least one initial carbon nanotube until the atoms of carbon are bound to the atoms of carbon having free binding sites on an edge of the free end.

20. The method according to claim 18, wherein each portion of the at least one initial carbon nanotube is arranged on a substrate; and further comprising applying a difference of potential between the substrate and an electrode placed near the substrate.

21. The method according to claim 18, wherein each portion of the at least one initial carbon nanotube is deposited on a substrate; and further comprising applying a difference of potential between electrodes arranged on a surface of the substrate.

22. The method according to claim 18, further comprising mixing each portion of the at least one initial carbon nanotube with a surfactant to form a suspension before supplying the atoms of carbon.

23. The method according to claim 1, wherein the atoms of carbon are supplied through a chemical vapor deposition while maintaining each portion of the at least one initial carbon nanotube in a methane atmosphere.

24. The method according to claim 18, wherein the steps of separating, electrically biasing and supplying are repeated n times, with n being greater than 1, to obtain a macroscopic amount of $2^n$ metallic or semiconductor nanotubes.

25. The method according to claim 24, wherein the macroscopic amount of $2^n$ nanotubes is arranged on a substrate, and the atoms of the carbon are supplied to determine a further autocatalyst addition so as to obtain a bundle of nanotubes grown on the substrate.

* * * * *

UNITED STATES PATENT AND TRADEMARK OFFICE
CERTIFICATE OF CORRECTION

PATENT NO. : 8,470,283 B2  
APPLICATION NO. : 11/913476  
DATED : June 25, 2013  
INVENTOR(S) : Vinciguerra et al.

Page 1 of 1

It is certified that error appears in the above-identified patent and that said Letters Patent is hereby corrected as shown below:

In the Claims:

Column 8, Line 18    Delete: "VLSI"  
                     Insert: --ULSI--

Signed and Sealed this  
Eighth Day of October, 2013

Teresa Stanek Rea  
*Deputy Director of the United States Patent and Trademark Office*